(12) United States Patent
Schwind

(10) Patent No.: US 9,581,626 B2
(45) Date of Patent: Feb. 28, 2017

(54) CIRCUIT AND METHOD FOR DETECTING ZERO-CROSSINGS AND BROWNOUT CONDITIONS ON A SINGLE PHASE OR MULTI-PHASE SYSTEM

(71) Applicant: DIEHL AKO STIFTUNG & CO. KG, Wangen (DE)

(72) Inventor: Mathew Schwind, Lisle, IL (US)

(73) Assignee: Diehl AKO Stiftung & Co. KG, Wangen (DE)

( * ) Notice: Subject to any disclaimer, the term of this patent is extended or adjusted under 35 U.S.C. 154(b) by 675 days.

(21) Appl. No.: 14/030,420

(22) Filed: Sep. 18, 2013

(65) Prior Publication Data

US 2014/0132246 A1 May 15, 2014

Related U.S. Application Data

(60) Provisional application No. 61/726,090, filed on Nov. 14, 2012.

(51) Int. Cl.
*G01R 25/00* (2006.01)
*G01R 19/165* (2006.01)
*G01R 19/175* (2006.01)

(52) U.S. Cl.
CPC ....... *G01R 25/00* (2013.01); *G01R 19/16538* (2013.01); *G01R 19/175* (2013.01)

(58) Field of Classification Search
CPC .......... H02H 3/08; H02M 7/515; G01R 25/00
USPC ............. 323/235; 327/78, 79, 530, 538, 540
See application file for complete search history.

(56) References Cited

U.S. PATENT DOCUMENTS

| | | | | |
|---|---|---|---|---|
| 4,598,354 A * | 7/1986 | Kindler | ..................... | B66B 1/28 187/296 |
| 4,728,866 A * | 3/1988 | Capewell | ................ | H02M 1/44 315/194 |
| 5,153,510 A * | 10/1992 | Kominsky | ............. | G01R 15/14 324/130 |
| 5,221,877 A * | 6/1993 | Falk | ..................... | H02M 5/2576 307/141 |
| 5,805,094 A * | 9/1998 | Roach | ........................ | G06F 3/05 341/144 |
| 6,002,717 A * | 12/1999 | Gaudet | .................. | G02B 23/18 375/232 |
| 6,400,119 B1* | 6/2002 | Garza | ................... | H02J 3/1892 318/729 |
| 7,400,481 B2* | 7/2008 | Pellon | ................ | G01R 31/1272 361/44 |
| 2002/0196048 A1* | 12/2002 | Sunter | .................. | G01R 31/048 324/762.01 |

(Continued)

*Primary Examiner* — Vinh Nguyen
*Assistant Examiner* — Alvaro Fortich
(74) *Attorney, Agent, or Firm* — Laurence A. Greenberg; Werner H. Stemer; Ralph E. Locher

(57) ABSTRACT

A circuit configuration detects zero-crossings and/or a brownout condition. The circuit configuration contains a zero-crossing detection circuit, a brownout detection circuit, an isolation and digitization circuit connected to the zero-crossing detection circuit and the brownout detection circuit, and a filtering circuit connected to the isolation and digitization circuit. The single circuit configuration can be used for detecting zero-crossings of single-phase and multi-phase systems as well as ascertaining a brownout condition of either the single-phase or the multi-phase systems.

16 Claims, 7 Drawing Sheets

(56) References Cited

U.S. PATENT DOCUMENTS

| | | | | |
|---|---|---|---|---|
| 2004/0100208 A1* | 5/2004 | Readio | H05B 41/2853 | 315/291 |
| 2006/0066258 A1* | 3/2006 | Lane | H02J 9/065 | 315/291 |
| 2006/0126241 A1* | 6/2006 | Unger | H02H 3/36 | 361/62 |
| 2007/0170171 A1* | 7/2007 | Shah | G01R 19/0084 | 219/497 |
| 2007/0253223 A1* | 11/2007 | Neidorff | H02M 1/4216 | 363/2 |
| 2008/0024074 A1* | 1/2008 | Mosebrook | H05B 37/0209 | 315/291 |
| 2009/0135629 A1* | 5/2009 | Mancebo del Castillo Pagola | H02M 5/42 | 363/34 |
| 2010/0066337 A1* | 3/2010 | Gong | H02M 1/4225 | 323/285 |
| 2011/0249476 A1* | 10/2011 | Chen | H02H 1/0007 | 363/52 |

* cited by examiner

CIRCUIT AND METHOD FOR DETECTING ZERO-CROSSINGS AND BROWNOUT CONDITIONS ON A SINGLE PHASE OR MULTI-PHASE SYSTEM

CROSS-REFERENCE TO RELATED APPLICATION

This application claims the priority, under 35 U.S.C. §119, of U.S. provisional application No. 61/726,090 filed Nov. 14, 2012, 2012; the prior application is herewith incorporated by reference in its entirety.

BACKGROUND OF THE INVENTION

Field of the Invention

The invention relates to a method for detecting zero-crossings and brownout conditions of a single-phase or a multi-phase system. The invention further relates to a circuit for detecting the zero-crossings and brownout conditions of the single-phase or multi-phase system.

In household appliances such as ovens, stoves, refrigerators, washers, dryers, etc. there is a need to detect the zero-crossings of one, two and three phase lines for driving relays and traics. This requires detection on multiple phases without prior knowledge of the phase angle differences. Most households receive electricity via a two-phase transformer with the phase being 180° apart. On the other hand, large apartment complexes and commercial buildings generally run on three-phase systems. With three-phase systems the electricity is either leading or lagging 120°. Therefore a household appliance must be able to recognize whether it is connected to a two-phase or three-phase source. More importantly, the household appliance needs to detect the zero-crossings of the phases. In A/C electrical terms a zero-crossing is the point where the voltage crosses from a negative voltage to a positive voltage or vice versa in a sinusoidal wave.

In addition, there is a need to detect brownout conditions to protect the household appliances. A brownout is an intentional drop in voltage in an electrical power supply system used for load reduction in an emergency. The reduction lasts for minutes or hours, as opposed to a short-term voltage sag or dip. The voltage reduction may be an effect of disruption of an electrical grid, or may occasionally be imposed in an effort to reduce load and prevent a blackout.

Different types of electrical apparatus will react in different ways to voltage sag. Some devices will be severely affected, while others may not be affected at all. The heat output of any resistance device, such as an electric oven will vary with the true power consumption, which is proportional to the square of the applied voltage. Therefore, a significant loss of heat output will occur with a relatively small reduction in voltage. Brownouts can cause unexpected behavior in systems with digital control circuits. Reduced voltages can bring control signals below the threshold at which logic circuits can reliably detect which state is being represented. As the voltage returns to normal levels the logic can latch at an incorrect state; even "can't happens" become possible. The seriousness of this effect and whether steps need to be taken by the designer to prevent it depends on the nature of the equipment being controlled; for instance a brownout may cause a motor to begin running backwards.

Therefore known household appliances have a separate circuit board for detecting brownouts, a circuit board for detecting zero-crossings, and a diagnostic circuit board.

SUMMARY OF THE INVENTION

It is accordingly an object of the invention to provide a circuit and a method for detecting zero-crossings and brownout conditions on a single-phase or multi-phase system which overcome the above-mentioned disadvantages of the prior art methods and devices of this general type, which efficiently tests for zero-crossings and brownout conditions using a single circuit board.

The advantage of the invention is that it combines brownout detection with multi-phase detection eliminating the need for multiple circuit boards. The invention further allows the use of relay life extension on isolated systems without the need for circuitry on each relay.

With the foregoing and other objects in view there is provided, in accordance with the invention, a circuit configuration for detecting zero-crossings and a brownout condition of a power supply. The circuit configuration containing a zero-crossing detection circuit for detecting zero-crossings of single-phase signals and multiple-phase signals, a brownout detection circuit, an isolation and digitization circuit connected to the zero-crossing detection circuit and the brownout detection circuit, and a filtering circuit connected to the isolation and digitization circuit and outputting an output signal indicating at least the zero-crossings and the brownout condition.

In accordance with an added feature of the invention, the isolation and digitization circuit has an optocoupler with an input side connected to the zero-crossing detection circuit and the brownout detection circuit and an output connected to the filtering circuit.

In accordance with an additional feature of the invention, the isolation and digitization circuit has a pull up resistor connected to the optocoupler.

In accordance with a further feature of the invention, the zero-crossing detection circuit has a series circuit of resistors and a diode connected to the series circuit of resistors.

In accordance with another feature of the invention, the diode has a first terminal connected to the isolation and digitization circuit. The diode blocks negative half waves traversing the isolation and digitization circuit. The diode has a second terminal connected to the series circuit of resistors.

In accordance with an another added feature of the invention, the series circuit of resistors has two series circuits of resistors each containing two resistors connected in series.

In accordance with a further added feature of the invention, the brownout detection circuit includes a first diode connected to the isolation and digitization circuit and blocks positive half waves traversing the isolation and digitization circuit, and a Zener diode circuit connected to the first diode. The Zener diode circuit has a given break down voltage. A resistor is connected to the Zener diode and functions as a current limiting resistor.

In accordance with a further additional feature of the invention, the break down voltage is at least 130 voltages and the resistor is one of two resistors connected in series.

In accordance with another additional feature of the invention, the Zener diode circuit has at least two Zener diodes connected in series and has a combined break down voltage of at least 130 volts. Alternatively, the Zener diode circuit has four Zener diodes connected in series and has a combined break down voltage of at least 130 volts, ideally 132 volts.

In accordance with yet another feature of the invention, the filtering circuit has an operational amplifier with a first input, a second input, and an output outputting the output signal.

In accordance with yet a further feature of the invention, the filtering circuit has a feedback resistor connected between the output and the first input of the operational amplifier.

In accordance with an added feature of the invention, the second input of the operational amplifier is connected to the output of the optocoupler.

With the foregoing and other objects in view there is further provided, in accordance with the invention, a circuit configuration for detecting zero-crossings and a brownout condition of a power supply having a signal phase or multi-phases. The circuit configuration containing a first terminal for connecting to a first phase of the power supply, at least one second terminal for connecting to at least one second phase of the power supply, a neutral terminal for connecting to the power supply, and a detection circuit having a first input coupled to the first terminal and the neutral terminal, a second input connected to the second terminal, and an output. The detection circuit detects zero-crossings of the first and second phases and a brownout condition of the first and second phases.

In accordance with an added feature of the invention, the detection circuit further has an optocoupler with a first opto-terminal coupled to the second terminal, a second opto-terminal coupled to the first terminal, and a third opto-terminal. A first diode has a first end connected to the first terminal and a second end connected to the second opto-terminal, the first diode blocking a negative voltage from the second opto-terminal. A second diode has a first end coupled to the neutral terminal and a second end connected to the second opto-terminal, the second diode blocking a positive voltage from the second opto-terminal. An amplifier circuit has an input connected to the third opto-terminal and an output outputting a voltage dependent on the zero-crossings of the first and second phases and the brownout condition.

With the foregoing and other objects in view there is provided, in accordance with the invention, a method for detecting zero-crossings. The method includes providing a single circuit having only three input terminals and is capable of detecting zero-crossings of either a single phase electrical signal or a multi-phase electrical signal. At least one zero-crossing is detected and filtered via the single circuit.

In accordance with an added mode of the invention, a brownout condition affecting the single phase electrical signal or the multi-phase electrical signal is detected.

Other features which are considered as characteristic for the invention are set forth in the appended claims.

Although the invention is illustrated and described herein as embodied in a circuit and a method for detecting zero-crossings and brownout conditions on a single-phase or multi-phase system, it is nevertheless, not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The invention relates to a method and a circuit for determining two different zero-crossing points of mains and to detect if the mains are experiencing a brownout condition. One zero-crossing comes from L1-L2 mains and is used to drive relays connected to the mains. The relays are switched with respect to the zero-crossing in order to extend their life as less voltage is switched at the zero-crossing. A second zero-crossing is used for the same purpose as the first only the zero-crossing point comes from line L1. These zero-cross points can be in-phase, 30° out of phase from one another or 330° out of phase from one another. This is due to the four different configurations of mains that the circuit could be connected to. The invention fulfills all these zero-crossing sensing needs with a single circuit, and the circuit combines all of the data into a single signal that can be read and processed by a microprocessor or similar processing circuitry.

Figure 1:
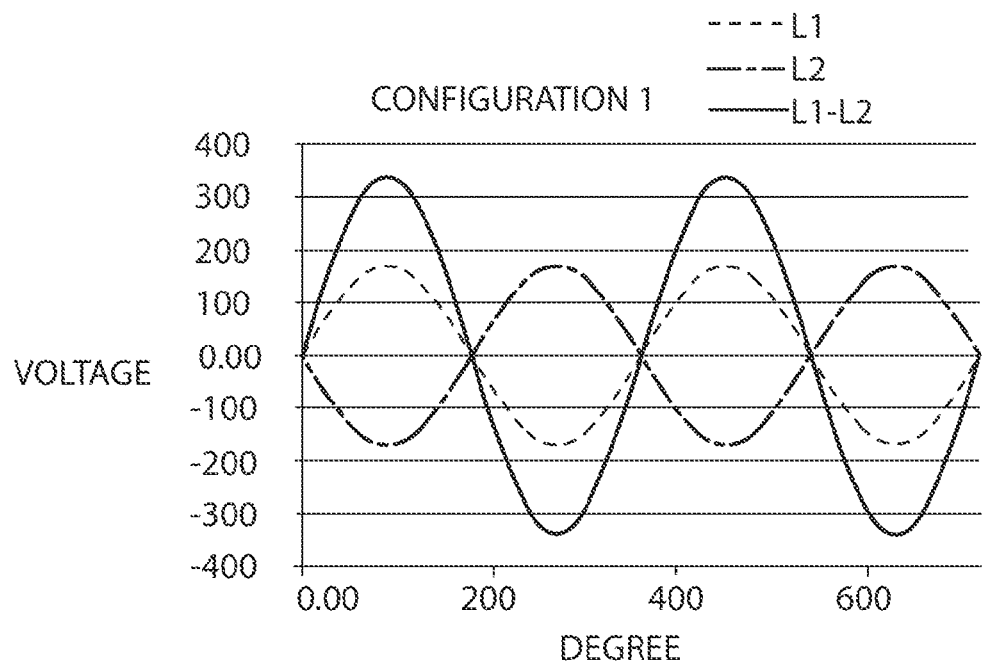
FIG. 1 is a graph showing a two-phase electrical signal.
Figure 2:
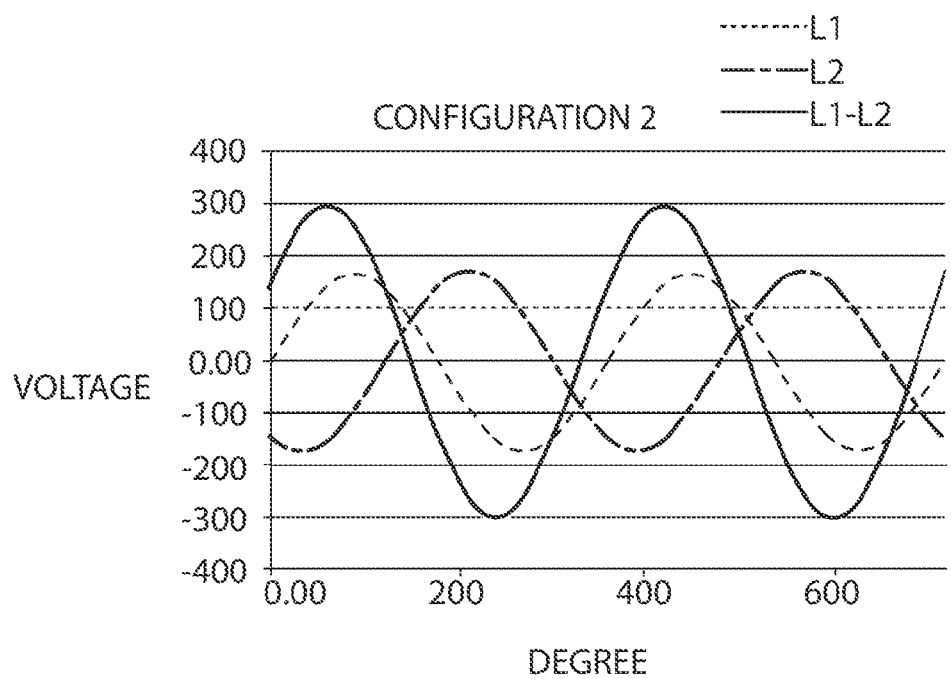
FIG. 2 is a graph showing two-phases, separated by 120°, of a three-phase electrical signal.
Figure 3:
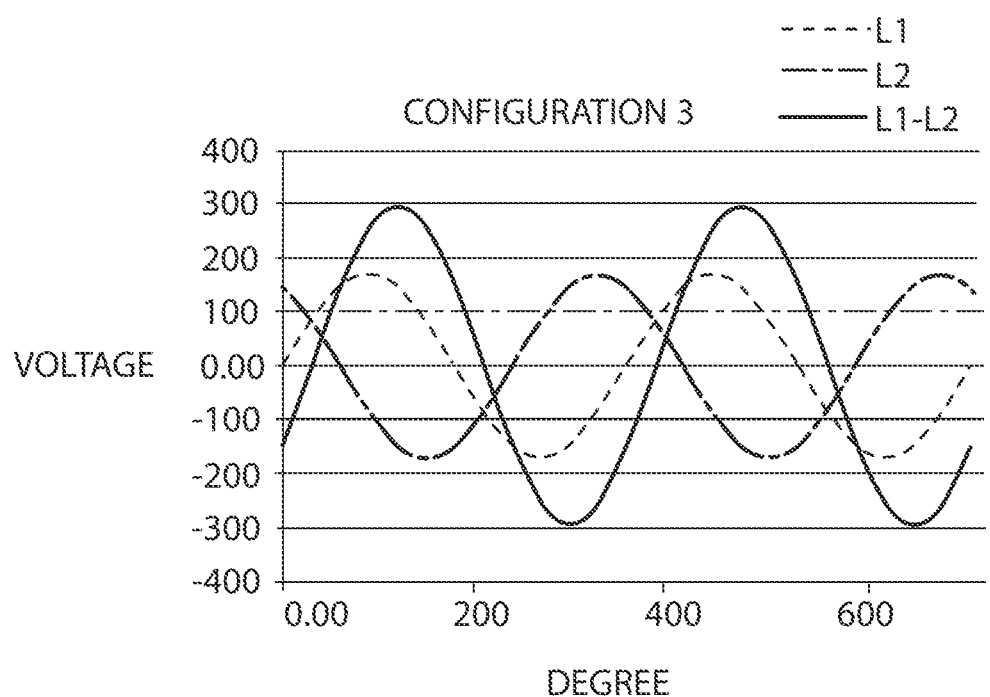
FIG. 3 is a graph showing two-phases, separated by 240°, of a three-phase electrical signal.

Three of the four different configurations of the mains are shown in FIGS. 1-3. FIG. 1 illustrates the power delivery found in a typical residential home, two-phase 240V 180° separation of phases (configuration one). FIGS. 2 and 3 are both three-phase and would be found in commercial buildings or apartment complexes. The configuration of FIG. 2 (configuration two) occurs when the phases are separated by 120° i.e. mains consists of L1 and L2. The configuration of FIG. 3 (configuration three) occurs when the phases are separated by 240° i.e. mains consists of L1 and L3. The three configurations of FIGS. 1-3 are all multi-phase and used on electric models that require 220 v or 240V. The last configuration (configuration four) is a single phase 120V and is used on the gas models. This configuration only needs one zero cross point.

Figure 4:
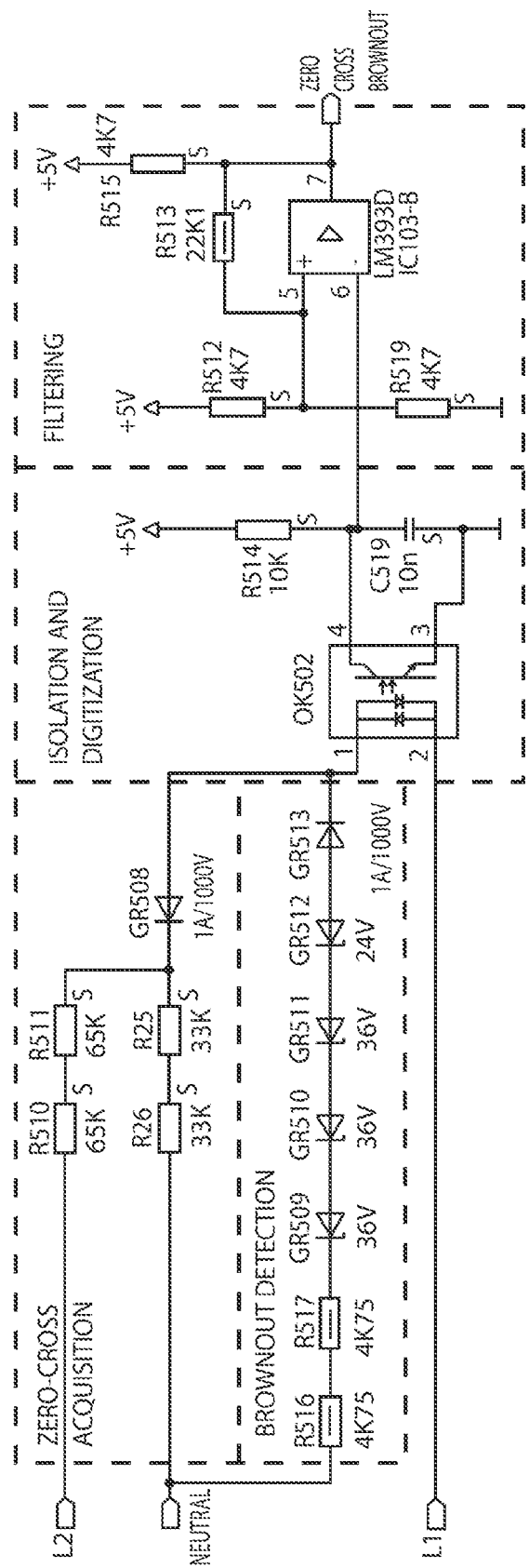
FIG. 4 is a circuit of a zero-crossings detector integrated with a brownout detector according to the invention.
Figure 5:
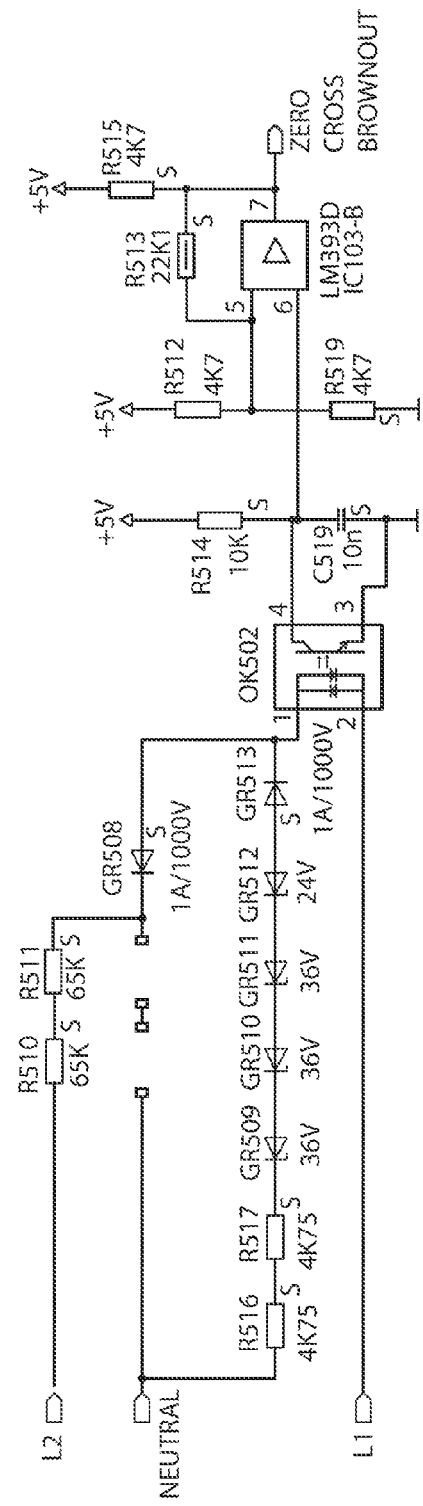
FIG. 5 is the circuit for zero-crossing detection integrated with the brownout detector configured for multi-phase detection.

FIG. 4 shows a full circuit for detecting the zero-crossings and the brownout condition. The circuit can be divided into four parts which includes: a zero-crossing acquisition part, a brownout detection part, an isolation and digitization part, and a filtering part. In the zero-crossing acquisition part, only one set of resistors will be used depending on the configuration of the mains. For this circuit to handle configuration four of the mains, being a single phase, the zero-cross acquisition part must be connected to neutral. Therefore the circuit will be configured like the circuit shown in FIG. 10 with resistors R510 and R511 removed. FIG. 5 shows the circuit configured for multi-phase operation with resistors R26 and R28 removed. For the preceding explanation of these parts we will refer to the multi-phase configuration as seen in FIG. 5.

Figure 6:
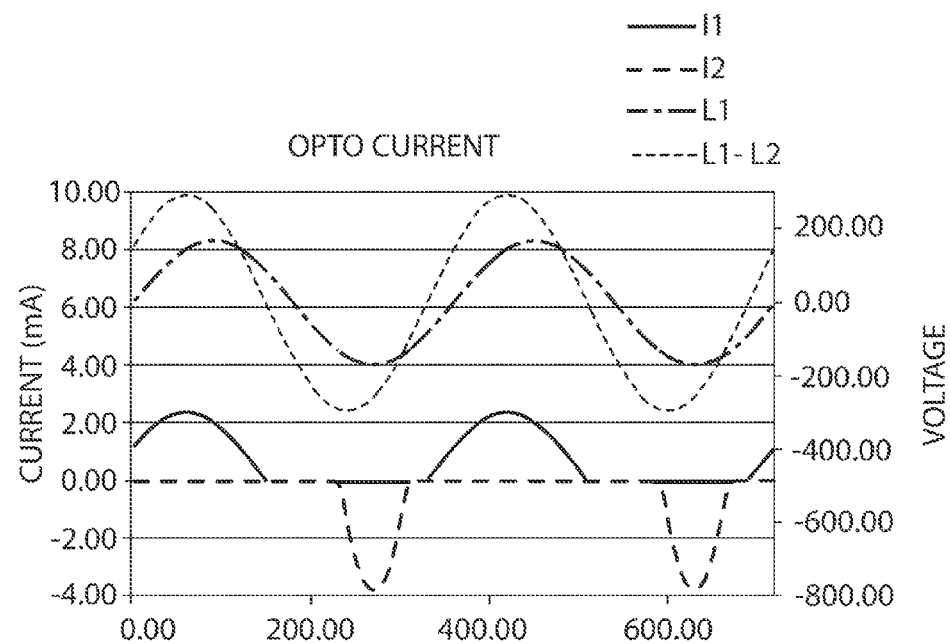
FIG. 6 is a graph showing a current output of an optocoupler.

The zero-cross acquisition works by rectifying the mains signal so that only the positive half wave of L1-L2 is sent through an optocoupler OK502. As well as configuring the resistors in the zero-crossing acquisition part to limit a current flowing through the optocoupler OK502. Positive current flows from L1 through the optocoupler OK502 then through diode GR508 and resistors R511, R510 and finally back to L2. The current can only flow in this manner because of the configuration of the diode GR508 allowing the passage of the positive half wave and diode GR513 blocking the passage of the positive half wave. The current is shown in FIG. 6 as I1. The beginning and end of the current I1 pulse marks the zero-crossing point and the peak is centered 90° from the zero-crossing of L1-L2 mains.

The brownout section part of the circuit works by rectifying and subtracting the mains signal. Only the current due to the voltage being above a brownout threshold of a negative half cycle of L1 is allowed to flow through the optocoupler OK502. Zener diodes GR509 to GR512 block (drop) 132 volts of the main voltage clipping the signal and allowing only the top part of the sinusoidal wave to flow, that part being greater than 132 volts. The resistors R516 and R517 limit the current that can flow to the optocoupler OK502. The diode GR513 limits the signal to only the negative half cycle of L1 to flow to through the optocoupler OK502. This produces signal I2 in FIG. 6. A negative peak of the current pulse I2 is centered 90° from the zero-crossing of L1. As the voltage on the mains drops toward the brownout level the current peak I2 will shrink and the base of the peak will get narrower. When the voltage reaches the brownout level, the peak will disappear thus alerting the system to the brownout condition.

Figure 7:
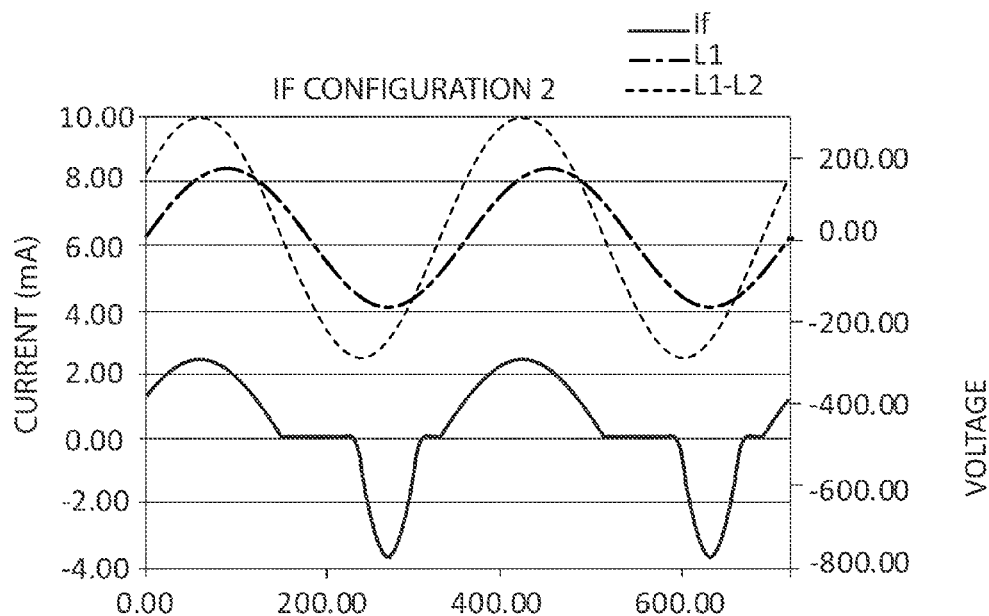
FIG. 7 is a graph showing the current output of the optocoupler for two-phases, separated by 120°, of a three-phase electrical signal (FIG. 2)
Figure 8:
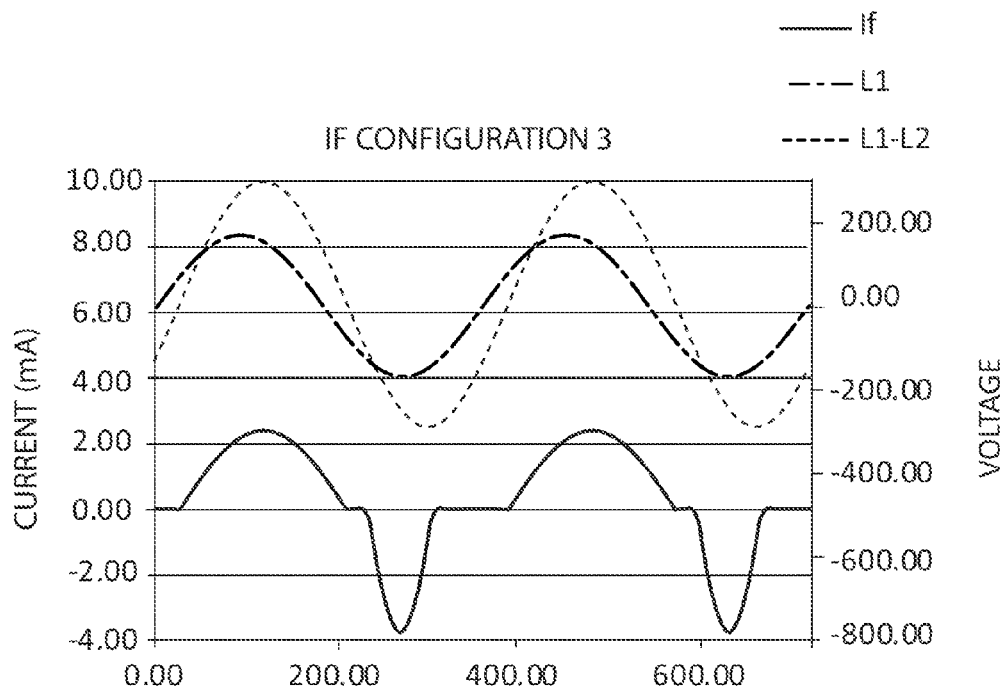
FIG. 8 is a graph showing the current output of the optocoupler for two-phases, separated by 240°, of a three-phase electrical signal (FIG. 3)
Figure 9:
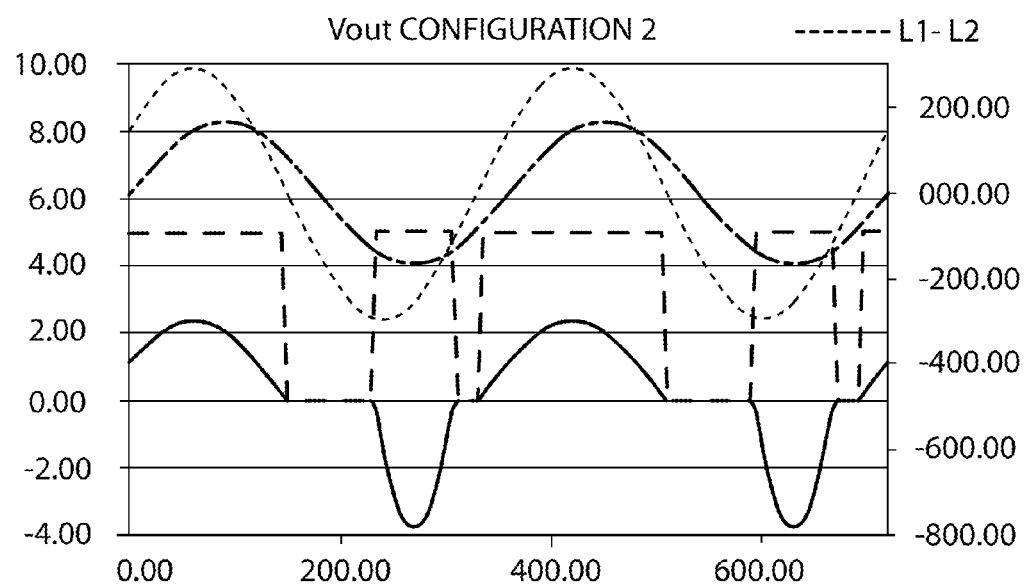
FIG. 9 is a graph showing an output of a filtering circuit for the current output of the optocoupler for two-phases, separated by 120°, of a three-phase electrical signal (FIG. 2)

Isolation and digitization is performed by the optocoupler OK502. The optocoupler OK502 is an A/C optocoupler that allows current flowing either direction through an input side. Therefore, the input sees a combination of currents I1 and I2 which we will now refer to as If. This is shown in FIGS. 7 and 8 for both configurations two and configuration three of the mains. The output of the optocoupler OK502 switches on/off when the voltage across the input is above/below 1.25 V. Meaning that a delay between when the current begins to rise, or fall, and the switch turns on is very small. When there is current flowing through the input, in either direction, a transistor in the optocoupler OK502 outputs a current flow. This in turn pulls a voltage on input pin 6 of an operational amplifier (OpAmp) LM393D low. When the optocoupler OK 502 is not conducting, the signal seen at the input 6 is pulled high, 5V, by pull-up resistor R514 and filtered by the capacitor C519. The output of the isolation and digitization circuit is a fully rectified square wave. This can be seen in FIG. 9.

Ic is the current flowing through the output of the optocoupler OK502. The voltage at input 6 of the OpAmp LM393D is based on the current Ic only it is a square wave of 5V amplitude. We can see from FIG. 9 that the two pulses of the signal Ic are centered around their respective mains partner. The wide pulse of the square wave is used to determine the zero-crossing of L1-L2. It is centered at the peak of L1-L2 so there is a zero-crossing 90° from this point. We do not use the edge because the delay of the circuit prevents it from being exactly at the zero-crossing. The phase of the small pulse with respect to the large pulse is determined by the mains configuration. If the mains is configured as configuration one or four then the center of the small pulse will be 180° out of phase with the center of the large pulse. If configuration two is used. Then the centers of the pulses will be 240° out of phase. If configuration three is used. Then the centers of the pulses will be 120° out of phase. Contained in the small pulse is two pieces of information first it is centered about the negative half cycle of L1 meaning that the zero-crossing is 90° in either direction. The pulse also contains the brownout information in the form of the width of the pulse. As the mains voltage drops the pulse will get narrower until it disappears at the brownout threshold.

The filtering part of the circuit includes the OpAmp LM393D that filters and conditions the signal to be used by a microprocessor that using the rising and falling edges for determining the zero-crossing and the existing of the smaller square wave for determining a brownout condition. The conditioning of the OpAmp LM393D is assisted by the feedback and conditioning resistors R513 and R519 along with the pull up resistors R512 and R515.

Figure 10:
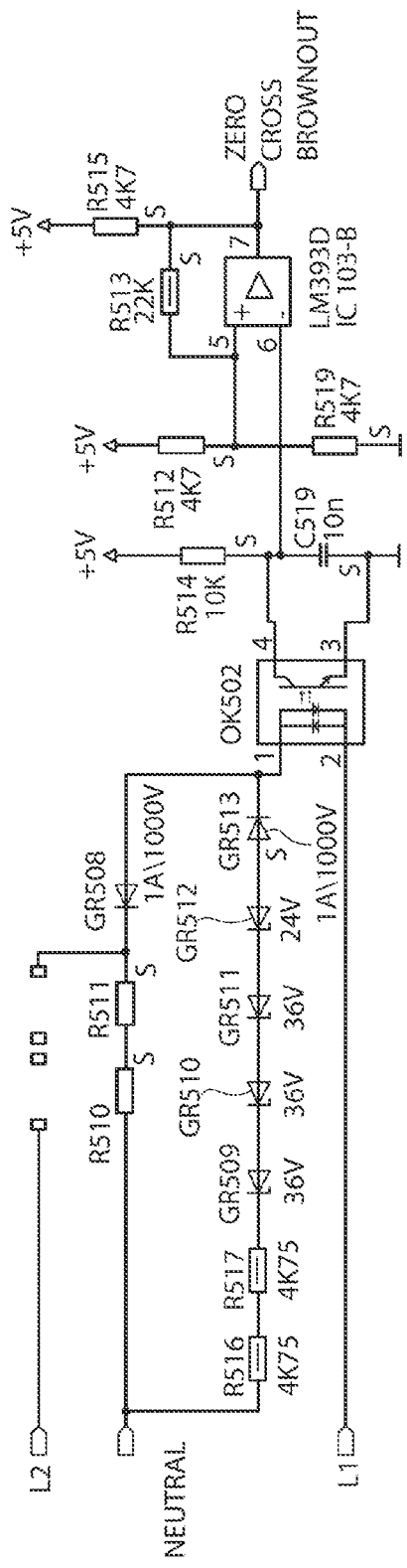
FIG. 10 is the circuit for zero-crossing detection integrated with the brownout detector of FIG. 4 configured for single phase detection.

The configuration of the circuit in FIG. 10 is used to handle a single phase. Separate configurations are used for a few reasons. First, the lack of a second mains line L2 means that one would need to connect the L2 signal to neutral to make the circuit work in single phase. However, you will notice that the configuration resistors are of different values. This is due to the different voltages. If the same 66 k resistors were used the current flowing through might be too low to produce a signal in all circumstances.

In summary, FIG. 4 is a circuit that is capable of being configured to detect zero-crossings of a signal phase or multi-phase system and brownout conditions. Therefore instead of needing three separate circuits as is standard in the prior art, the invention of the instant application accomplishes these tasks with one simple circuit. Therefore the invention of the instant application saves money, reduces circuit complexity and increases reliability.

The invention claimed is:
1. A circuit configuration for detecting zero-crossings and a brownout condition of a power supply, the circuit configuration comprising:
 a zero-crossing acquisition circuit for acquiring zero-crossings of single-phase signals and multiple-phase signals and having a zero-crossing signal terminal;
 a brownout acquisition circuit having a brownout signal terminal connected to said zero-crossing signal terminal;
 an isolation and digitization circuit having a terminal connected to both said zero-crossing signal terminal and said brownout signal terminal for detecting a zero-crossing and the brownout condition; and
 a filtering circuit connected to said isolation and digitization circuit and outputting an output signal indicating at least the zero-crossings and the brownout condition.

2. The circuit configuration according to claim 1, wherein said isolation and digitization circuit has an optocoupler with an input side connected to said zero-crossing acquisition circuit and said brownout acquisition circuit and an output connected to said filtering circuit.

3. The circuit configuration according to claim 2, wherein said isolation and digitization circuit has a pull up resistor connected to said optocoupler.

4. The circuit configuration according to claim 1, wherein said zero-crossing acquisition circuit has a series circuit of resistors and a diode connected to said series circuit of resistors.

5. The circuit configuration according to claim 4, wherein:
said diode has a first terminal connected to said isolation and digitization circuit, said diode blocking negative half waves traversing said isolation and digitization circuit; and
said diode has a second terminal connected to said series circuit of resistors.

6. The circuit configuration according to claim 4, wherein said series circuit of resistors has two series circuits of resistors each containing two resistors connected in series.

7. The circuit configuration according to claim 1, wherein said brownout acquisition circuit including:
a first diode connected to said isolation and digitization circuit and blocking positive half waves traversing said isolation and digitization circuit;
a Zener diode circuit connected to said first diode, said Zener diode circuit having a given break down voltage; and
a resistor connected to said Zener diode and functioning as a current limiting resistor.

8. The circuit configuration according to claim 7, wherein:
said break down voltage is at least 130 voltages; and
said resistor is one of two resistors connected in series.

9. The circuit configuration according to claim 7, wherein said Zener diode circuit has at least two Zener diodes connected in series having a combined break down voltage of at least 130 volts.

10. The circuit configuration according to claim 1, wherein said Zener diode circuit has four Zener diodes connected in series having a combined break down voltage of at least 130 volts.

11. The circuit configuration according to claim 2, wherein said filtering circuit having an operational amplifier with a first input, a second input, and an output outputting the output signal.

12. The circuit configuration according to claim 11, wherein said filtering circuit having a feedback resistor connected between said output and said first input of said operational amplifier.

13. The circuit configuration according to claim 12, wherein said second input of said operational amplifier is connected to said output of said optocoupler.

14. A circuit configuration for detecting zero-crossings and a brownout condition of a power supply having a signal phase or multi-phases, the circuit configuration comprising:
a first terminal for connecting to a first phase of the power supply;
at least one second terminal for connecting to at least one second phase of the power supply;
a neutral terminal for connecting to the power supply;
a detection circuit having a first input coupled to said first terminal and said neutral terminal, a second input connected to said second terminal, and an output, said detection circuit acquiring zero-crossings of the first and second phases and a brownout condition of the first and second phases, said detection circuit further having an optocoupler with a first opto-terminal coupled to said second terminal, a second opto-terminal coupled to said first terminal and receiving both the zero crossings and the brownout condition, and a third opto-terminal.

15. The circuit configuration according to claim 14, said detection circuit further having:
a first diode having a first end connected to said first terminal and a second end connected to said second opto-terminal, said first diode blocking a negative voltage from said second opto-terminal;
a second diode having a first end coupled to said neutral terminal and a second end connected to said second opto-terminal, said second diode blocking a positive voltage from said second opto-terminal; and
an amplifier circuit having an input connected to said third opto-terminal and an output outputting a voltage dependent on the zero-crossings of the first and second phases and the brownout condition.

16. A method for operating a detector circuit for detecting zero-crossings and brownout conditions, which comprises the steps of:
acquiring a zero-crossing signal along a first signal path having a zero-crossing terminal;
acquiring a brownout condition signal along a second signal path having a brownout condition terminal, the brownout condition terminal being connected to the zero-crossing terminal;
submitting the brownout condition signal and the zero-crossing signal to a same terminal of control logic for determining a zero-crossing condition and the brownout condition.

* * * * *